United States Patent [19]

Engeler et al.

[11] 4,103,343

[45] Jul. 25, 1978

[54] CHARGE TRANSFER APPARATUS

[75] Inventors: William E. Engeler, Scotia; Howard S. Goldberg, Schenectady, both of N.Y.

[73] Assignee: General Electric Company, Schenectady, N.Y.

[21] Appl. No.: 702,944

[22] Filed: Jul. 6, 1976

[51] Int. Cl.² .............................................. G11C 11/34
[52] U.S. Cl. ...................................... 365/183; 357/24; 365/45
[58] Field of Search ....................... 340/173 R; 357/24; 365/183, 45

[56] References Cited

U.S. PATENT DOCUMENTS

| 4,004,157 | 1/1977 | Baertsch et al. | 357/24 |
| 4,011,442 | 3/1977 | Engeler | 340/173 LS |

OTHER PUBLICATIONS

Baertsch et al., A New Surface Charge Analog Store, 1973, International Electron Devices Meeting, Technical Digest, 3-5 Dec. 1973, pp. 134-137.
Mayer, Split-Gate CCD Sensing, RCA Technical Note No. 1148, 4/27/76.

Primary Examiner—Stuart N. Hecker
Attorney, Agent, or Firm—Julius J. Zaskalicky; Joseph T. Cohen; Marvin Snyder

[57] ABSTRACT

Signal processing apparatus is disclosed comprising a plurality of charge storage cells, each including first and second storage regions in a semiconductor substrate. Means are provided responsive to a scanning signal for introducing into each of the cells a respective quantity of charge, a first portion of which is contained in one of the storage regions and represents a respective analog signal sample. Means are provided for transferring each first portion of charge from one storage region to the other storage region in a respective cell in response to a respective second signal. Means are provided connected in circuit with the first electrodes for sensing the charge transferred to and from the first charge storage regions of the cells for detecting the signal samples.

12 Claims, 13 Drawing Figures

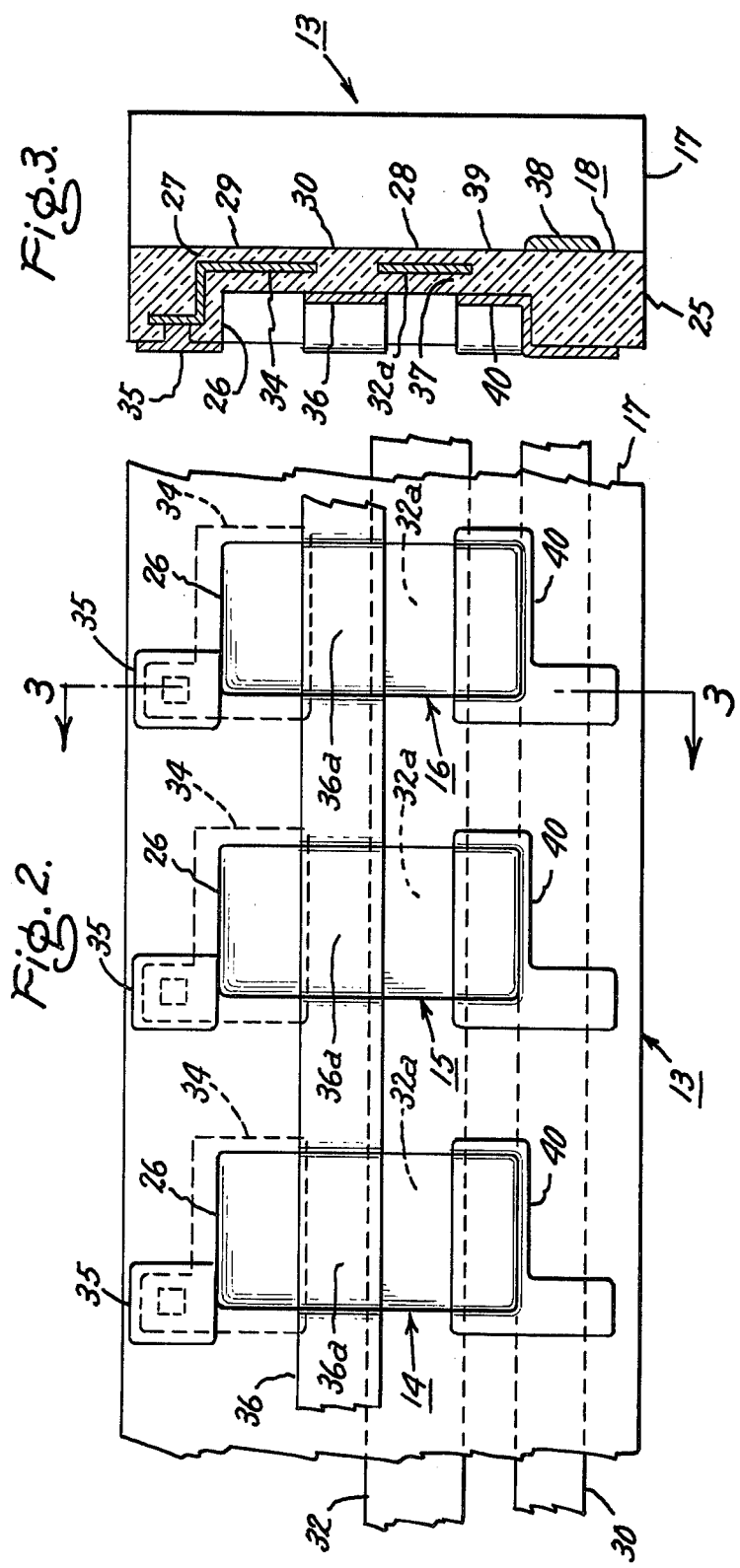

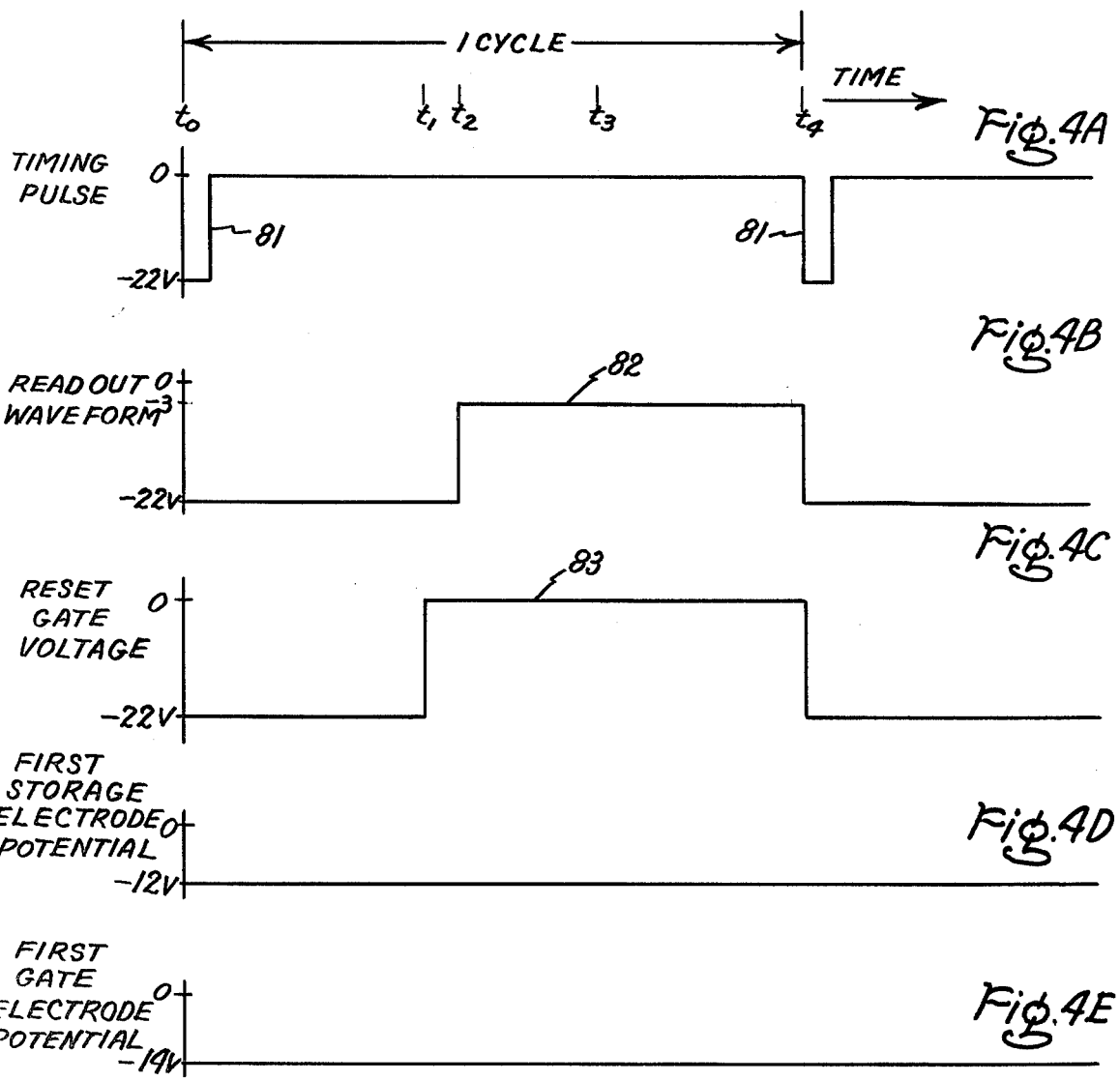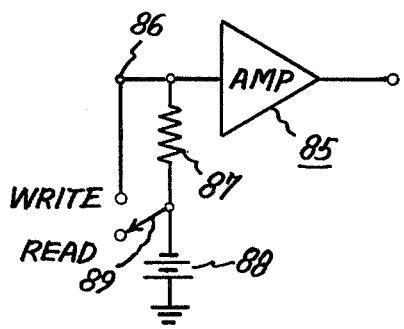

CHARGE TRANSFER APPARATUS

The present invention relates to improvements in signal processing apparatus utilizing charge transfer devices.

The subject matter of this patent application is related to the subject matter of patent application Ser. No. 702,942 and patent application Ser. No. 702,943, both filed concurrently herewith, now U.S. Pat. Nos. 4,058,716, and 4,058,717, respectively, and assigned to the assignee of the present invention. The aforementioned patent applications are incorporated herein by reference thereto.

One form of charge transfer device includes a pair of charge storage regions in a semiconductor substrate underlying two adjacent electrodes separated by a transfer gate for transferring charge between the charge storage regions. Such charge transfer devices have been organized in various arrays to perform various functions such as analog memory, signal correlation, and signal transformation. In such arrays the devices are operated in a "charge sloshing" mode in which charge is repeatedly transferred from one storage region to the other storage region of a device. In such arrays an electrode common to a plurality of devices of the array is utilized for readout of signals. The transfer of charge to the storage regions underlying the common electrode induces a signal on it and provides the output signal. If a transfer voltage is applied to the transfer gate of the device to effect the transfer of charge between storage regions, some of the transfer voltage is coupled to the output electrode. This undesired signal often is much greater than the desired output. This undesired signal also varies from device to device of the array as it is dependent on the overlapping capacitances of the devices which are not uniform. Complex balancing circuits have been utilized to reduce the undesired signal. However, such circuits are not completely effective in eliminating the component of undesired signals due to the varying overlapping capacitances of the array. Such circuits also not only increase the complexity of the array but also limit the speed of operation of the array.

The present invention is directed to overcoming limitations, such as mentioned above, and also is directed to providing improvements in signal processing apparatus utilizing charge transfer devices.

An object of the present invention is to provide improved signal processing apparatus utilizing charge transfer devices.

Another object of the present invention is to provide signal readout in charge transfer devices in which clock noise is minimized.

Another object of the present invention is to provide simple readout circuits in arrays of charge transfer devices.

Another object of the present invention is to provide arrays of charge transfer devices for signal processing which are capable of operation at high speed.

In carrying out the invention in one embodiment in signal processing apparatus there is provided a substrate of semiconductor material in which a plurality of charge storage cells are formed. Each cell includes a first charge storage region and also a second charge storage region adjacent a major surface of the substrate. The second charge storage region is separated from the first charge storage region by an intermediate region. A first plurality of interconnected electrodes are provided, each electrode insulatingly overlying a respective first storage region. A second plurality of second storage electrodes, each electrode insulatingly overlying a respective second storage region. A plurality of interconnected first gating electrodes are provided, each insulatingly overlying a respective intermediate region. Means are provided for applying a fixed first potential to the interconnected first gating electrodes to establish a depletion surface potential in each of the intermediate regions of a fixed first value. Means are provided for applying a second potential to the first storage electrodes to establish a depletion surface potential of a second value in each of the first storage regions less in absolute magnitude than the fixed first value. Means are provided for introducing into each of the charge storage cells a respective quantity of charge, a first portion of which is contained in one of the storage regions and represents a respective sample of a first signal. Means are provided for transferring the first portion of charge from one storage region to the otherstorage region in each cell of a selected plurality of cells in response to a second signal. Means are provided connected in circuit with the first electrodes for sensing the charge transferred to and from the first charge storage regions of the selected cells.

The features which are believed to be characteristic of the present invention are set forth with particularity in the appended claims. The invention itself both as to its organization and method of operation, together with further objects and advantages thereof may best be understood by reference to the following description taken in connection with the accompanying drawings in which FIG. 1 is a block diagram of surface charge signal processing apparatus in accordance with an embodiment of the present invention;

FIG. 2 is a plan view of an assembly of charge storage cells of the surface charge signal processing apparatus of FIG. 1 integrated on a single substrate;

FIG. 3 is a sectional view of the assembly of FIG. 2 taken along sectional lines 3—3 thereof;

Figure 1:
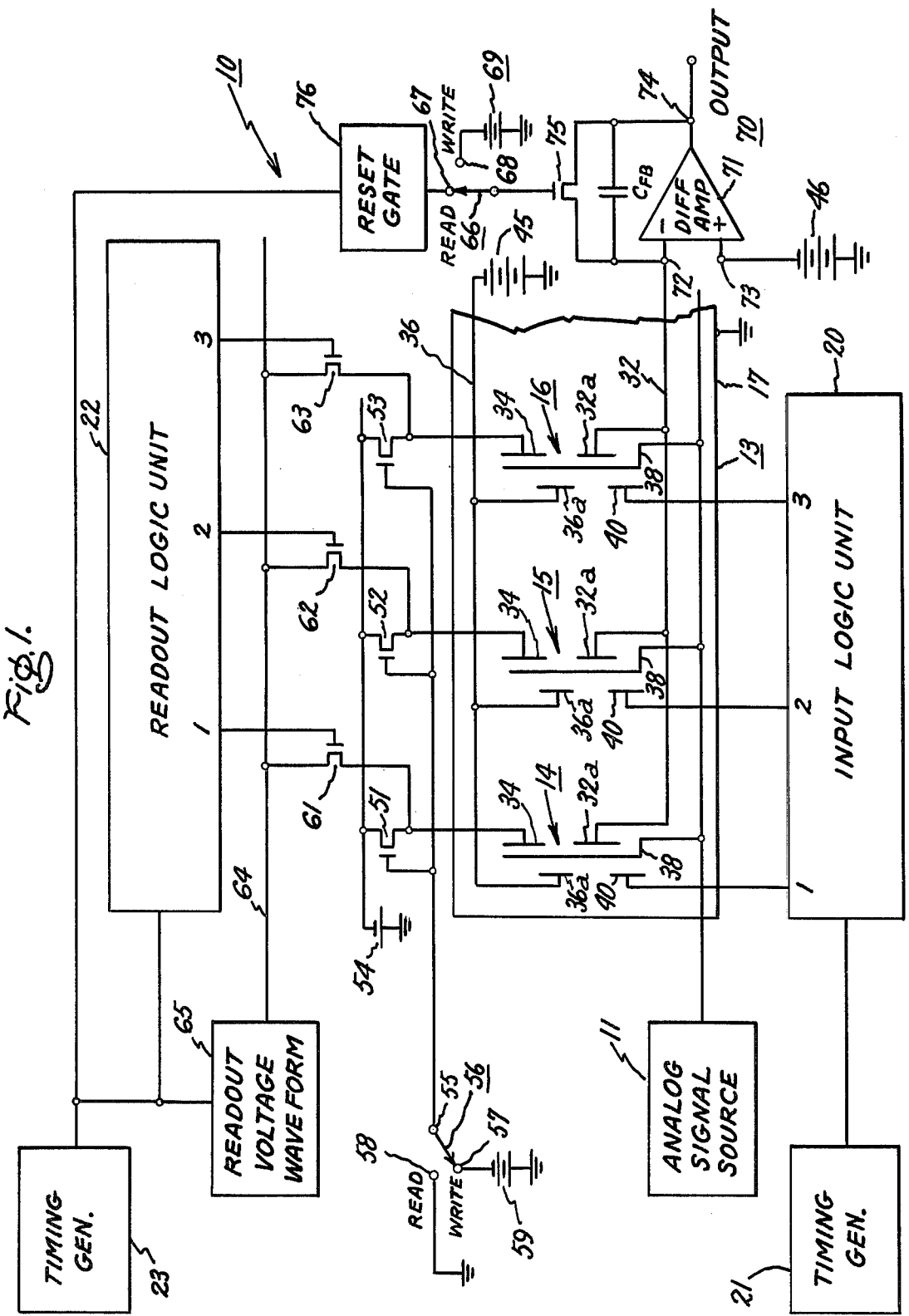
Figure 5A:
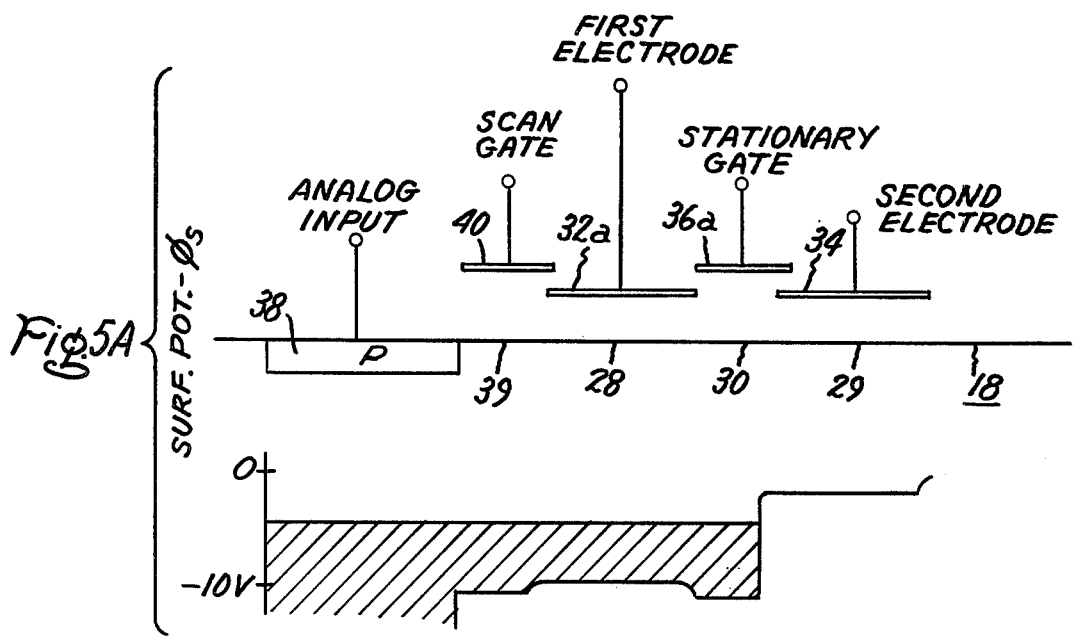
Figure 5B:
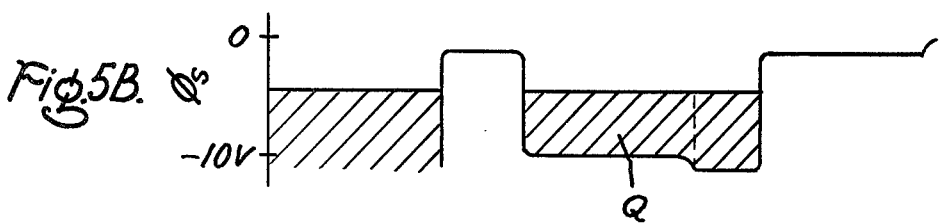
Figure 5C:
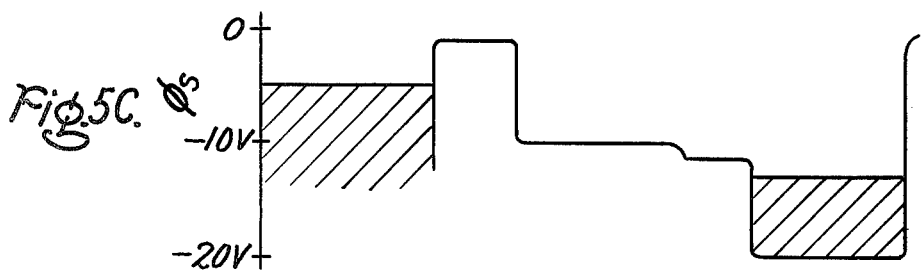
Figure 5D:
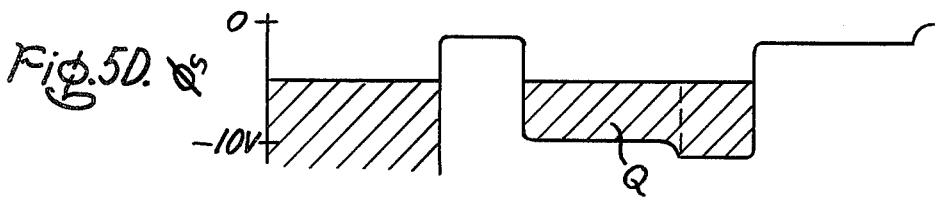

FIGS. 4A thru 4E are diagrams of amplitude versus time of voltage waveforms occurring at various points in the apparatus of FIG. 1 useful in explaining the operation thereof;

FIG. 5A shows a sectional view of a charge storage cell of the apparatus of FIG. 1 and also includes a diagram of semiconductor surface potential versus distance along the semiconductor surface of a device when a gating pulse is applied to the scan gate thereof to sample an analog signal;

FIG. 5B is a diagram of semiconductor surface potential versus distance along the semiconductor surface of the charge storage cell of FIG. 5A at an instant of time after the applied gating pulse has disappeared and a packet or quantity of charge Q is stored in the device proportional to a sample of a time varying analog signal;

FIG. 5C is a diagram of the semiconductor surface potential versus distance along the semiconductor surface of a cell at an instant of time in a first interval of a cycle of operation of the apparatus of FIG. 1, referred to as the reset phase;

FIG. 5D is a diagram of the semiconductor surface potential versus distance along the semiconductor surface of a cell at an instant of time in a second interval of a cycle of operation of the apparatus of FIG. 1, referred to as the read phase; and FIG. 6 shows a read out circuit which does not require periodic resetting during read out of signals and which can be used in place in place of the differential amplifier read out circuit of FIG. 1.

Reference is made to FIG. 1 which shows analog memory apparatus 10 for sampling and storing packets of charge representing samples of a time varying analog signal applied from source 11. The apparatus 10 includes an assembly 13 of a plurality of charge transfer devices 14, 15 and 16 formed on a common substrate 17, only three of which are shown for reasons of simplicity in describing the apparatus and explaining the operation thereof. The apparatus also includes a multistage input logic unit 20, each stage of which is operatively associated with a respective charge transfer device for sequentially gating samples of the analog signal into the charge transfer devices. The input logic unit 20 is under the control of or timed by timing generator 21. A read-out logic unit 22 is also provided, each stage of which is operatively associated with a respective charge transfer device. The read out logic unit may include read only memories, or random access memories, or logic trees or shift registers, as described in connection with the aforementioned patent applications Ser. No. 702,942 and Ser. No. 702,943, filed concurrently herewith. The readout logic unit provides voltages at the output terminals of the various stages thereof to control the sequence of read out of the charge packets stored in the various devices. The read out unit is under the control or timed by timing generator 23.

The analog signal samples may be read into the devices in sequence under the control of the input logic unit 20 over a first period of time. Over a second period of time the stored samples may read out in any sequence desired under the control of the readout logic unit 22. Over a first interval of a read out cycle of operation of the apparatus, the potential on an electrode of one of the devices 14–16 is reset to transfer a previously introduced quantity of charge, corresponding to an analog signal sample and stored in a first storage region thereof, into a second storage region thereof. Over a second interval of the cycle of operation the potential on the electrode of the device is changed to transfer the quantity of stored charge back to the first charge storage region and obtain a read out, as will be explained below in more detail.

As shown in FIGS. 2 and 3, the devices are formed on a common substrate 17 of, for example, N-type conductivity silicon of suitable resistivity and having a major surface 18. A layer of thick insulation 25 which may conveniently be silicon dioxide is provided overlying the major surface 18. A plurality of generally rectangular recesses 26 are provided in the thick insulating member 25, each corresponding to the location of a respective charge transfer device. Each of the recesses 26 extends to within a short distance of the major surface of the semiconductor substrate to provide a region of thin insulation 27 lying over the substrate and defining a charge transfer cell therein. Each of the charge transfer cells 14–16 includes a first charge storage region 28 and a second charge storage region 29 spaced from the first charge storage region and defining a respective first intermediate region 30 therebetween, all adjacent the major surface 18. Overlying the thick and thin portions of the insulating member and extending generally perpendicular to the long dimension of the recesses 26 is a conductive member or line 32. The portions of the conducting member 32 lying in the recesses constitute a first plurality of electrodes 32a, each electrode overlying a respective first storage region 28 of a charge transfer device or cell. A second plurality of electrodes 34 are provided, each electrode in a respective recess and each overlying a respective second charge storage region 29 in the charge transfer cells. Terminals 35 provide electrical connection to the electrodes 34. A second layer 37 of thin insulation is provided in each of the recesses 26. Overlying the thick and thin portions of the insulating member and extending generally perpendicular to the long dimension of the recesses 26 is a conductive member or line 36. The portions of the conductive member 36 lying in the recesses constitute a first plurality of gating electrodes 36a, each overlying a respective intermediate region 30. Also provided in the semiconductor substrate is a diffused region 38 of P-type conductivity spaced from the first charge storage regions 28 of each of the cells and defining a respective second intermediate region 39 therebetween. A second plurality of gating electrodes 40 are provided, each in their respective recess and each overlying a respective second intermediate region 39.

Referring now particularly to FIG. 1, the first gating electrodes 36a of each of the devices 14–16 are connected to the negative terminal of a source 45 of potential, the positive terminal of which is connected to ground to establish a surface potential in each of the first intermediate regions 30 of a fixed first value.

The line 36 and gating electrodes 36a are constituted of a good conductive material, such as aluminum, which provides an essentially very low impedance between the electrodes 36a and the source 45. Also, the source 45 is selected to present a very low impedance at the frequencies of operation of apparatus. In accordance with one aspect of the invention the gating electrode functions as a shield to electrically isolate the first storage electrodes on which output signals are sensed from the second storage electrodes to which clocking signals are applied from the read out logic unit. To this end it is essential that the electrodes 36a be maintained at a-c ground as closely as practical. To enhance the shielding action each electrode 36a may be extended to insulatingly overlay a substantial portion of a respective storage electrode 34. Each of the first storage electrodes 32a of each of the devices 14–16 are interconnected by the line 32 which can be set at a fixed second potential for establishing in each of the first storage regions a depletion surface potential of a second value, as will be explained below. The manner in which the potential of the line 32 is set at the fixed value is by means of a differential amplifier connected to a source 46 of fixed potential, as will also be explained below. The source 46 of fixed potential is set to provide the second value of depletion surface potential to be less in absolute magnitude than the fixed first value of surface depletion potential. The diffused region 38 of opposite conductivity type is connected to an analog signal source 11. Each of the second gating electrodes 40 is connected to a respective stage of the input logic unit 20.

Each of the second storage electrodes 34 is connected through the source to drain conductor path of a respective one of transistor switches 51, 52 and 53 to the negative terminal of a source 54 of potential the positive terminal of which is connected to ground. The gates of transistors 51–53 are connected to the armature terminal 55 of sample switch 56 which also includes a write terminal 57 and a read terminal 58. The write terminal 57 is connected to the negative terminal of source 59, the positive terminal of which is connected to ground. The read terminal 58 is connected to ground. The sample switch 56 which provides a voltage from source 57 to turn on the transistors 51–53 during the period when the analog signal is being sampled and quantities of charge proportional to the analog samples are being introduced or written into the devices. The voltage of the source 54 is set at a level to provide a surface potential in storage regions 29 which blocks the flow of charge thereinto from the storage regions 28 underlying first electrodes 32a. To sample the analog signal and store the samples in the analog memory 10, initially the transistor switches 51–53 are closed by setting armature of sample switch 56 to contact write terminal 57. Thereafter, a pulse is applied from the input logic unit 20 to each of the second gating electrodes 40 in sequence to sample the analog signal appearing on the diffused region 38 and transfer into each of the first storage regions 28 of the devices in sequence a respective quantity of charge proportional to a respective sample of the analog signal.

Each of the second storage electrodes 34 is also connected through the source to drain conduction path of respective one of transistor switches 61, 62 and 63 to a buss 64 which, in turn, is connected to read out voltage waveform generator 65. The read out voltage waveform generator 65 is synchronized with the timing generator 23. The read out voltage waveform applied to a second storage electrode 34 establishes a first level of depletion surface potential in the second storage region 30 during a first interval of a cycle thereof. The first level of depletion surface potential is greater in absolute magnitude than the aforementioned fixed first value of depletion surface potential and the second level of depletion surface potential is less in absolute magnitude than the aforementioned second value of depletion surface potential. The first level of depletion surface potential in the second storage region 29 allows charge to flow into the second storage regions 29 and the second level of depletion surface potential in the second storage region 29 blocks the flow of charge thereinto. The gates of transistors 61–63 are connected to respective ones of output terminal 1–3 of readout logic unit 22. The read out logic unit is synchronized with the timing generator and turns "ON" the output terminals, 1–3 in a predetermined sequence. The "ON" condition of an output terminal has the same duration as a cycle of the readout voltage waveform and is synchronized therewith. Thus, complete cycles of the read out voltage are applied in the predetermined sequence to the second storage electrodes 34, as will be explained in greater detail below. When the read out voltage waveform is applied to a second electrode of one of the devices 14–16 in response to an "ON" signal appearing on a corresponding output terminal of the read out logic unit, a packet of charge representing an analog sample stored in the first storage region of the device is transferred into the second storage region thereof over the aforementioned first interval of time. Over the aforementioned second interval of time, as the depletion surface potential of the second storage region is raised above the depletion surface potential of the first storage region charge, the packet of charge is transferred back into the first storage region, causing a signal to be induced on the output buss 32 representative of the packet of charge transferred during the second interval.

The electrode 32 to which all of the first storage electrodes 32a are connected serves as the output electrode on which is induced a signal proportional to the charge transferred to the first charge storage regions 28 during the second interval of a cycle of operation. For the purpose of deriving the output signal and also for the purpose of setting and maintaining the potential on the line 32 at a fixed value during the time of analog signal sampling, the output circuit 70 including differential amplifier 71 is provided. The differential amplifier 71 comprises a high gain differential amplifier having an inverting input terminal 72 and a noninverting input terminal 73 and an output terminal 74. The differential amplifier may be any of a variety of operational amplifiers commercially available for example, operational amplifier LM 318 available from National Semiconductor Co. of Santa Clara, Calif. The inverting input terminal 72 is connected to the output line 32. The output terminal 74 is connected to the inverting terminal 72 through a feedback capacitance $C_{FB}$. The noninverting terminal 73 is connected to the negative terminal of a source 46 of voltage, the positive terminal of which is connected to ground. The potential of the inverting terminal 72 of the high gain differential amplifier with capacitance feedback follows the potential of the noninverting terminal 73. Thus, the differential amplifier delivers a voltage at the output terminal 74 which is proportional to the difference in induced charge on the output line 32 divided by the feedback capacitance $C_{FB}$. A reset switch in the form of a MOSFET transistor 75 is connected across the feedback capacitance $C_{FB}$. When a reset voltage from reset gate generator 76 which is synchronized with clock 24 is applied to the gate of the reset transistor 75, the potential applied to the output line 32 is equal to the potential of the source 46. When the reset switch 75 is opened and thereafter charge is transferred to the first storage regions 28 of the devices 14–16 underlying the first storage electrodes 32a, a signal is induced on the output line 32. The differential amplifier 71 with capacitance feedback operates to maintain the potential on the output line 32 the same as the potential at the noninverting terminal 73. The resulting charge flow in the output circuit of the amplifier and to the capacitor $C_{FB}$ produces a voltage at output terminal 74 which is proportional to the total net charge transferred to the first storage regions 28. The aforementioned charge sensing circuit is described and claimed in U.S. Patent Application Ser. No. 591,636, filed June 30, 1975, now U.S. Pat. No. 3,969,636. Alternative means may be provided to sense on the output line 32 the total net charge transferred to the first storage regions 28. For example, after resetting the output line 32, it may be allowed to float and the change in potential thereon sensed to provide the output signal. A two position reset selector switch 66 is provided having an armature connected to the gate of transistor 75 and having a "read" terminal 67 connected to the reset gate generator 76 and a "write" terminal 68 connected to the negative terminal of source 69 the positive terminal of which is connected to ground. During the read out operation of the memory apparatus the armature of switch 66 is contacted to read terminal 67. During "write" or sampling of an analog signal the armature of switch 66 is contacted to write terminal 68 thereby closing switch 75 and providing the potential of bias source 46 on line 32 when introducing charge packets into the first storage regions of the apparatus.

The operation of the memory apparatus of FIG. 1 over a cycle of operation will now be explained in connection with the waveform diagrams of FIGS. 4A through 4E and also in connection with the surface potential diagrams of FIGS. 5A through 5D. To facilitate description of the operation of the memory apparatus, specific values of depletion surface potentials in the various regions of the charge transfer devices 14–16 are shown in FIGS. 5A through 5D. These potentials are produced by applying suitable voltages to the electrodes overlying the various regions of the devices, for example, several volts higher than the indicated depletion surface potentials. The voltages required on the electrodes depends on the materials used and other geometric details for the devices, as is well known to those skilled in the art.

FIGS. 4A through 4E show waveforms of voltages appearing at various points in the apparatus of FIG. 1 over a period greater than one clock cycle but less than two clock cycles of operation thereof. All of the waveforms are drawn to a common time scale. Each cycle of the readout voltage waveform applied to the second storage electrodes is constituted of two intervals, the interval from $t_0$ to $t_2$ is designated the first interval, and the interval from $t_2$ to $t_4$ is designated the second interval. FIG. 4A shows timing pulses 81 obtained from the timing generator 23. Pulses 81 are utilized to time both the read out logic unit 22 and the read out waveform generator 65 and also to synchronize the operation thereof. FIG. 4B shows the readout voltage waveform 82 which is applied to a second storage electrode 34 of a charge transfer device in response to an "ON" condition appearing on an associated output terminal of the readout logic unit 22. FIG. 4C shows the pulse voltage 83 applied from reset gate generator 76 to the gate of the reset transistor 75 of the differential amplifier 71 to reset the potential of the output line 32 to a fixed voltage during the first interval of the cycle of operation and to release the operation of the differential amplifier 71 just prior to the second or read interval of the cycle thereby providing an output proportional to the transfer of charge to the first storage region underyling the electrode of charge transfer device selected for readout during the second interval. FIG. 4D shows the potential of the first storage electrodes 32a and the output line 32 of the apparatus. FIG. 4E shows the potential applied to the first gate electrodes 36a of the charge transfer devices.

The manner in which the analog signal is samples and quantities of charge proportional to the analog signal samples are introduced in various cells or devices of the memory apparatus, referred to as the "write" operation, will now be explained in connection with the diagrams of FIGS. 5A and 5B. An analog signal is applied to diffused region or line 38. Initially, the sample switch 56 is set to the "write" position to provide a small value of surface potential in storage regions 29 and inhibit the transfer of charge thereto. The reset selector switch 66 is set into the "write" position to provide a fixed value of surface potential in the first storage regions as explained above. Under the control of the timing generator 21 the input logic unit 20 provides pulses to the scanning gates 40 in a predetermined sequence. When a pulse appears at a scan gate, the surface potential of the region underlying the scan gate is lowered and charge flows from the diffused region 38 into the first storage region 28 and equilibrates with the signal during the occurrence of the pulse, as shown in FIG. 5A. On termination of the pulse on the scan gate 40, a quantity of charge Q is stored in the first storage region 28 underlying the first storage electrode 32a which is proportional to the amplitude of the analog signal, as shown in FIG. 5B. After the analog samples are loaded into the various devices, they are stored in the first storage regions 28 of the devices or cells and can be read out as desired.

To read out the charge stored in the memory apparatus, the sample switch 56 is set to the "read" position in which the fixed source 54 is disconnected from the second storage electrodes. The reset selector switch 66 is also set to the "read" position and connects the reset transistor 75 to the reset gate generator 76. Read out of each of the cells or devices is determined by the readout logic unit 22. Read out of a cell or device occurs when the terminal associated with the device is turned "ON", thereby applying the readout voltage waveform 82 of FIG. 4B to the second storage electrode of the device. During the first interval, $t_0$–$t_2$, the readout voltage waveform 82 drops to a value of −22 volts thereby enabling the quantity or packet of charge stored in the first storage region to flow into the second storage region underlying the second storage electrode, as illustrated in FIG. 5C. During the second interval $t_2$–$t_4$, the first voltage rises to −3 volts and causes the charge in the second storage region to flow back into the first storage region. At an instant $t_3$ in the second interval substantially all of the charge is back in the first storage region, as shown in FIG. 5D. Just prior to the rise of the first voltage to the −3 volts, at time $t_1$, the reset switch 75 is opened by reset gate voltage of FIG. 4C and the charge flowing into the first storage region 28 is sensed on line 32 by the output charge sensing circuit, as explained above.

In the mode of operation depicted above in connection with the waveform diagrams of FIGS. 4A–4E and in connection with the semiconductor surface potential diagrams of FIGS. 5A–5D, a charge sample was stored in the first storage region 28, and was initially transferred to the second storage region 29 and then back to the first storage region. The quantity of stored charge was sensed on the first storage electrode 32a during the transfer of the charge back to the first storage region. The charge stored could as well have been sampled on the first storage electrode during the transfer of charge out of the first storage region into the second charge storage region. Of course, the opening of the reset switch 75 would be made to occur just prior to such transfer to release the operation of the differential amplifier 71 to provide an output proportional to the charge transferred.

Another mode of sensing the stored charge is by means of a simple amplifier 85 such as shown in FIG. 6, connected to the output line 32 in place of the differential amplifier shown. The input terminal 86 of the amplifier would be connected to the output line 32 and also through a high impedance 87 to a bias source 88 of −12 volts to provide the appropriate depletion surface potential to the first storage regions 28. The input terminal 86 would also be connected directly to the −12 volt source 88 through a switch 89 operated during the "write" period of operation of the apparatus to maintain the depletion surface potential of the first storage region at the proper value. The output signal is obtained in a manner similar to the manner described above. After sampling the analog signal, switch 89 is switched to the read position and the terminal 86 connected to line 32 is allowed to float except for the relatively high impedance 87 which compensates for long term leakage or drift. Charge is cycled in each cell from one storage region to the other storage region and back under the control of the read out logic unit 22. The cycling of charge in the cells induces an a-c signal on the line 32 which is amplified by the amplifier 85. Since the same charge leaves as it enters a first storage region 28 underlying electrode 32a, no net change of voltage appears on the line 32 which is thus maintained at a fixed average potential. This mode of operation is advantageous when a high speed of read out is required. Note that the speed of readout is limited only by the charge transfer times in the cells and in the frequency response of the amplifier 85. Note also that switch 89 is actuated only once for the read out of all of the cells of the memory apparatus. In this mode of operation the analog signal may be obtained by demodulation or rectification of the amplified signal appearing at the output of the amplifier 85. Also, if desired, repeated readout of the cells of the memory apparatus may be obtained by recycling the charge stored in the cells as in the case of the other modes of operation described above.

In another highly advantageous mode of operation the charge samples could have been stored in the second storage regions of the apparatus and each sample could have been cycled into and out of the first charge storage regions and sensed in any of the ways described in the preceding paragraphs. The capacitance of each of the electrodes 32a to substrate when a depletion producing voltage is applied thereto consists of a dielectric capacitance and a depletion capacitance in series therewith. The dielectric capacitance is the capacitance between the electrode 32a and the surface of the semiconductor substrate. The depletion capacitance is the capacitance of the depletion region which extends inward from the surface of the substrate. The depletion capacitance is smallest when the depletion or storage region is empty of mobile charge. As the depletion capacitance of a storage region filled with charge is usually only a small fraction of the dielectric capacitance, its series capacitance dominates. Thus it is apparent that to provide a total capacitance on output line 32 of a low value charge samples should be stored in the second storage regions 29 underlying electrodes 34 and cycled into and out of empty storage regions 28 for read out. This may be conveniently accomplished by a second series of switches that connect the unselected cells to a potential which is sufficient to store the charge.

In the operation of the cells of the memory apparatus depicted in FIGS. 5A-5D, a first portion of charge Q representing a signal sample is contained in the storage region underlying the first electrode 32a as shown in FIG. 5B. The charge Q along with charge contained in the intermediate region 30 underlying electrode 36a is transferred to the storage region 29 by applying a suitable voltage to electrode 34 to lower sufficiently the depletion surface potential of the region 29 to contain all the charge as shown in FIG. 5C. The charge in the storage region 29 is transferred out of this region into the first storage region 28 and the intermediate region 30 by applying another suitable voltage to electrode 34 to raise sufficiently the depletion surface potential of the region 29 so that all the charge can be contained in the first and intermediate regions. The two surface depletion voltage levels of storage region 29 are set so that for the magnitude of charge, samples to be processed, the charge can be completely contained either in the first storage region and the intermediate region or in the second storage region, to avoid spurious signal generation due to the fact that all the charge cannot be transferred. To assure this the two depletion surface potentials of second storage regions 29 are set so that the difference in potential of the bottom of an empty potential well of one storage region and the top of the filled potential well of the other storage region of the cell is several volts.

As is well known to those skilled in the art, in charge transfer devices such as described herein the storage regions formed by the application of depletion producing voltages to the cells or device gradually accummulate thermally generated charge which degrades the stored charge or signal. Accordingly, where very large arrays of devices are used or where extensive rereading of the charge samples is desired, or for other reasons for which the samples are to be stored for long periods of time the charge samples would be refreshed either concurrently with read out operation or subsequent thereto. In devices formed on good quality silicon substrates, for example, N-type silicon of 5 ohm-cm resistivity, the devices could be operated for several hundred milliseconds before there would be significant deterioration in signal due to thermally generated charge and refresh would be required. With each of the first and second storage regions having surface dimensions of about 10 by 20 micrometers and the intermediate region having a width of about 6 micrometers separating the first and second storage regions in the direction of the short dimension of these regions, substantial charge transfer from one storage region to the other can be obtained in a few nanoseconds. Thus, the memory apparatus can be cycled many times before refresh is needed.

In connection with the operation of the amplifier of FIG. 6, thermally generated charge would tend to change the potential of line 32 to which terminal 86 would be connected. The resistor 87 of high impedance would enable charge to flow to the line 32 to maintain the potential thereof at the potential of source 88.

In connection with the geometric proportioning of the cells or devices, it has been found that with the first electrode 32a and the second electrode 34 of a cell separated by about 6 micrometers, and hence with the width of the intermediate region 30 underlying electrode 36a of the same value, excellent isolation of the first electrode 32a from clocking or charge cycling voltages on electrode 34 is achieved without significant increase of charge transfer time. To achieve the isolation the gating electrodes would have to be maintained at a-c ground as pointed out above. Of course, making the intermediate region narrower would decrease charge transfer time, but at the expense of increase clock voltage feed-through. Conversely, clock voltage feed-through would be further decreased by increasing the width of intermediate region 30, however, the decrease would be at the expense of longer charge transfer times. A particularly useful mode of operation of the memory apparatus of FIG. 1 is to provide analog signal delay. In such a mode the packets of charge corresponding to samples of a time varying analog signal would be introduced in sequence into the cells over a first period of time. Over a second period of time subsequent to the first period of time the charge in each of the cells would be cycled in sequence and a readout obtained. The read out would be a replica of the time varying analog signal delayed by the time interval between the first and second periods of time. If desired the stored samples could be recycled and repeated read outs obtained.

In a still further mode of operation the apparatus could have utilized surface charge devices proportioned as shown in FIGS. 2 and 3 of the above-mentioned copending patent application Ser. No. 702,942 and operated as shown in FIGS. 5A and 5B of that application with the equal samples stored in both the first storage region 28 and the second storage region 29 of a device. Cycling all the charge of a device initially into the second storage region and then back into both storage regions would enable the stored charge sample to be sensed on the first storage electrode 32a during the transfer of charge out of the first storage region or during the transfer of charge back into the first storage region. Also the circuit of FIG. 6 could have been used instead of the differential amplifier 71. Similarly, the equal samples of charge in the first and second storage region of a device initially could have been cycled into the first storage region and then back into both storage regions. Any of the sensing means described above could have been used to sense the samples of charge stored in the devices.

While in connection with the apparatus of FIG. 1 one technique was shown and described utilizing a diffused line 38 and scan gates for introducing signal samples into each of the cells, it will be understood that other techniques may be utilized, for example, the "fill and spill" technique for loading a charge transfer filter described in connection with FIGS. 8A-8C of patent application Ser. No. 609,415, filed Sept. 2, 1975, now U.S. Pat. No. 4,032,867, and assigned to the assignee of the present invention. Also, while the quantities of charge representing signal samples have been described as being sequentially gated into the various cells, other systems for introducing the charge may be utilized, for example, a charge transfer shift register having as many stages as there are storage cells in the apparatus and in which the charge samples are serially clocked into shift register and then shifted in parallel into the various cells may be utilized.

While the invention has been described in connection with an analog memory and various modes of operation thereof as well as with correlator apparatus in the aforementioned copending applications Ser. No. 702,942 and Ser. No. 702,943, it will be understood that the invention is not limited thereto and is applicable generally to signal processing apparatus utilizing charge transfer devices.

While the invention has been described in connection with charge transfer devices constituted of N-type conductivity substrates, P-type conductivity substrates could as well be used. Of course, in such a case the applied potentials, diffusions and carrier types would be reversed in polarity.

While the invention has been described in specific embodiments, it will be appreciated that modifications may be made by those skilled in the art, and it is intended by the appended claims to cover all such modifications and changes as fall within the true spirit and scope of the invention.

What we claim as new and desire to secure by Letters Patent of the United States is:

1. Charge transfer apparatus comprising
a substrate of semiconductor material having a major surface,
a plurality of charge storage cells in said substrate adjacent said major surface, each including a first charge storage region, a second charge storage region, and an intermediate region separating said regions,
a plurality of first storage electrodes, each electrode insulatingly overlying a respective first charge storage region, said electrodes being interconnected,
a plurality of second storage electrodes, each electrode insulatingly overlying a respective second charge storage region,
a plurality of first gating electrodes, each insulatingly overlying a respective intermediate region, said gating electrodes being interconnected,
means for applying a fixed first potential to said interconnected first gating electrodes to establish a depletion surface potential in each of said intermediate regions of a fixed first value,
means for applying a second potential to said first storage electrodes to establish a depletion surface potential of a second value in each of said first storage regions less in absolute magnitude than said first value,
means for introducing into each of said charge storage cells a respective quantity of charge representing a respective sample of a first signal,
transfer means for transferring a first portion of charge from one storage region to the other storage region in each cell of a selected plurality of cells,
output means connected in circuit with said first electrodes for sensing the net total charge transferred to and from the first charge storage regions of said selected cells.

2. The apparatus of claim 1 in which said means for transferring charge includes means for applying a voltage waveform to a selected plurality of said second storage electrodes, said voltage waveform establishing a first level of depletion surface potential in said second storage region and a second level of depletion surface potential in said second storage region,
said first level of depletion surface potential being greater in absolute magnitude than said fixed first value of depletion surface potential and said second level of depletion surface potential being less in absolute magnitude than said second value of depletion surface potential,
wherey said first portions of charge are transferred from the first storage regions of selected cells to the second storage regions thereof when said first level is established and said first portions of charge are transferred from said selected second storage regions to said first storage regions when said second level is established.

3. The apparatus of claim 1 in which said transfer means transfers in sequence each of said first portions of charge in said selected plurality of cells.

4. The apparatus of claim 1 in which said transfer means transfers simultaneously said first portions of charge in said selected plurality of cells.

5. The apparatus of claim 1 in which said first signal is an analog signal and said first portions of charge correspond to samples of said analog signal including means for introducing each of said first portions of charge in sequence into respective ones of said selected plurality of cells over a first period of time and means for transferring in sequence each of said first portions of charge within said selected plurality of cells over a second period of time subsequent to said first period, whereby said output means provides an output signal having components each corresponding to a respective sample of said analog signal, said output signal being delayed in time from the occurrence of said analog signal.

6. The apparatus of claim 5 in which said transfer means includes means for recycling said first portions of charge within said selected cells and retransferring said first portions of charge within said selected cells thereby obtaining subsequent outputs from said output means.

7. The apparatus of claim 1 in which said transfer means includes means for repeatedly transferring each of said first portions of charge from said one storage region to said other storage region of a respective cell.

8. The apparatus of claim 1 in which said output means includes an amplifier having an input terminal connected to said first electrode and a resistance connecting said first storage electrodes to a voltage source providing said second value of potential in said first storage region.

9. Charge transfer apparatus comprising
a substrate of semiconductor material having a major surface,
a charge storage cell in said substrate adjacent said major surface including a first charge storage region, a second charge storage region, and an intermediate region separating said regions,
a first storage electrode insulatingly overlying said first charge storage region,
a second storage electrode insulatingly overlying said second charge storage region,
a gating electrode insulatingly overlying an intermediate region,
means for applying a fixed first potential to said gating electrode to establish a depletion surface potential in said intermediate region of a fixed first value,
means for applying a second potential to said first storage electrode to establish a depletion surface potential of a second value in said first storage region less in absolute magnitude than said first value,
means for introducing into said charge storage cell a quantity of charge representing a first signal,
means for transferring a first portion of said quantity of charge from one storage region to the other storage region of said cell,
means connected in circuit with said first electrode for sensing the charge transferred to and from the first charge storage region of said cell.

10. The apparatus of claim 9 in which the separation of said first and second storage region by said intermediate region is sufficiently great to shield said first storage electrode from potentials existing on said second storage electrode.

11. The apparatus of claim 10 in which said separation is greater than 6 micrometers.

12. The apparatus of claim 10 in which said gating electrode insulatingly overlies a substantial portion of said second storage electrode.

* * * * *